(12) United States Patent
Inamine et al.

(10) Patent No.: US 6,676,440 B1
(45) Date of Patent: Jan. 13, 2004

(54) COIN TYPE ELECTRIC ELEMENT AND PRINTED CIRCUIT BOARD WITH A COIN TYPE ELECTRIC ELEMENT

(75) Inventors: Shoichi Inamine, Sumoto (JP);
Masahiro Imanishi, Sumoto (JP);
Yoshitaka Minamida, Sumoto (JP);
Katsuyuki Kida, Mihara-gun (JP);
Nobuhiro Nishiguchi, Sumoto (JP);
Seiji Morita, Sumoto (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 10/412,584

(22) Filed: Apr. 14, 2003

(51) Int. Cl.$^7$ ................................................. H01R 3/00
(52) U.S. Cl. ............................. 439/500; 439/83; 429/1
(58) Field of Search ....................... 439/500, 83; 429/1, 429/96, 97, 98, 99, 100

(56) References Cited

U.S. PATENT DOCUMENTS 4,623,206 A * 11/1986 Fuller ........................... 439/81
6,142,823 A * 11/2000 Ishibashi ..................... 439/500
6,376,109 B1 * 4/2002 Sano et al. ..................... 429/1

* cited by examiner

*Primary Examiner*—Tho D. Ta
(74) *Attorney, Agent, or Firm*—Wenderoth, Lind & Ponack, L.L.P.

(57) ABSTRACT

A printed circuit board with a coin type electric element of the present invention has the coin type electric element, and printed circuit board, on which the coin type electric element is fixed by soldering. The coin type electric element have a coin exterior case formed of metal and in a coin shape with an opening; a sealing plate, which is fixed on the opening of the coin exterior case, sealing the coin exterior case; and an insulating seal interposed between the coin exterior case and the sealing plate. The coin exterior case and the sealing plate are composed of a pair of terminals, A lead, whose tip portion is bent toward a surface side of a first terminal face, is connected to a second terminal face of the coin type electric element. A soldering face to be soldered by reflow soldering is provided at the tip portion.

23 Claims, 5 Drawing Sheets

COIN TYPE ELECTRIC ELEMENT AND PRINTED CIRCUIT BOARD WITH A COIN TYPE ELECTRIC ELEMENT

This application is based on Application No, 2001-100787 filed in Japan on Mar. 30, 2001, and No. 2003-20322 filed in Japan on Jan. 29, 2003, the contents of which are incorporated hereinto by reference.

FILED OF THE INVENTION

The present invention relates to a coin type electric element such as a coin type battery and a printed circuit board with a coin type electric element, which is mounted by soldering thereon.

BACKGROUND OF THE INVENTION

A coin type electric element, such as a coin type battery and a coin type capacitor, has a pair of terminals in both ends. In such a coin type electric element, a sealing plate seals opening of the coin exterior case with a bottom, which encloses bottom side of the case. The sealing plate is fixed on the coin exterior case and held by an insulating seal interposed between them, and seals a coin exterior case alrtightly. The sealing plate is insulated from the coin exterior case by the insulating seal. The sealing plate and exterior case, which are insulated from each other, are used as a pair of electrodes. As shown in FIG. 1, in the coin type electric element of such a construction, the electrodes 105, which are the exterior case 103 and the sealing plate 10, are connected to a pair of leads 106 by spot welding. The ends of the two leads 106 are fixed on the conductive regions 109 of a printed circuit board 102 by soldering.

As shown in FIG. 1, the coin type electric element 101 mounted on the printed circuit board 102 by the two leads 106 by soldering. As shown in FIG. 2, soldering portions 106B of the coin type electric element 101 makes the mount area on the printed circuit board 102 large. The reason is that the soldering portions 106B of the leads 106 project outwardly from the coin type electric element 101. Further, such a construction has a disadvantage that the mount area becomes larger when the soldering portions of the leads are enlarged in order to be fixed firmly.

Furthermore, in such a construction, when the leads are shortened in order to make the mount area small, the coin type electric element mounted on the printed circuit board tends to have a thermal influence caused by a heated soldering iron or melted solder. Especially, It is important to heat the lead to high temperature capable of sufficient melting solder in order to fix the lead firmly on the printed circuit board. The reason is that insufficient heating the lead causes a cold joint. Insufficient heating the lead deteriorates the flow of the melted solder, therefore the solder can not be in intimate contact with a large area of the surface of the lead. Accordingly, it is Important to heat the lead sufficiently to avoid a cold joint. The lead is heated by the soldering Iron thrust thereon. When solder becomes the temperature capable of sufficient melting of It by heating, the solder on a soldering Iron flows along the surface of the lead, and spreads in a large area. In order to diffuse solder widely, it is necessary to heat the lead sufficiently by a soldering iron. An operator thrusts soldering Irons to the lead and heats it until the solder flows widely on the surfaces of the leads. In the case that a coin type electric element sensitive to heat is soldered, leads should be heated carefully. If the temperature of the leads is too high, the coin type electric element has a thermal influence. While, If the temperature of the leads is too low, it causes a cold Joint. Especially, in a method of using a soldering iron, an operator adjusts heating by soldering irons with a visual check of a state of the solder. Therefore, it is very difficult to keep ideal soldering consistently.

Reflow soldering can perform temperature control exactly as compared with the method of using a soldering iron, However, since reflow soldering heats altogether by a hot air current, not only the lead but also the coin type electric element are heated. Therefore, as shown in FIG. 1, when the ends of the both leads are fixed on to the printed circuit board by reflow soldering, heating the whole of the coin type electric element to high temperature can damage the coin type electric element.

The present invention is devised to solve the above problems, and is aimed at providing a coin type electric element, which can be mounted on a small mount area and can be fixed firmly and with stability on a printed circuit board by soldering, and can prevent from a thermal influence, and a printed circuit board with a coin type electric element, which is mounted by soldering thereon.

SUMMARY OF THE INVENTION

A coin type electric element of the present invention have a coin exterior case formed of metal and in a coin shape with a bottom and an opening; a sealing plate, which is fixed on the opening of the coin exterior case, sealing airtightly the coin exterior case; and an insulating seal, which is interposed between the coin exterior case and the sealing plate, insulating the coin exterior case from the sealing plate. In the coin type electric element, one of the bottom of the coin exterior case and the sealing plate as a pair of terminals is a first terminal face. The other of the bottom of the coin exterior case and the sealing plate as the pair of the terminals is a second terminal face. A first soldering face to be fixed by reflow soldering is provided on the first terminal face. A second soldering face to be fixed by reflow soldering is provided on a tip portion of a lead connected to the second terminal face. The first soldering face and the second soldering face are positioned substantially in a same plane.

In this specification, "the first soldering face and the second soldering face are positioned substantially in a same plane" is defined such that the first soldering face and the second soldering face are positioned at positions capable of reflow soldering together.

The coin type electric element is a coin type battery or a capacitor. Further, in the coin type electric element, the tip portion of the lead is bent toward a surface side of the first terminal face, and an insulating film 8 is provided on a position, which opposes to the bent portion, in a surface of the bottom of the coin exterior case or a surface of the sealing plate. Furthermore, the first soldering face in the first terminal face is plated with a metal having an affinity for solder. In addition, the first soldering face is provided by fixing a metal film on the first terminal face.

A printed circuit board with a coin type electric element of the invention have the coin type electric element having a coin exterior case formed of metal and in a coin shape with a bottom and an opening, a sealing plate, which is fixed on the opening of the coin exterior case, sealing the coin exterior case airtightly, and an insulating seal, which is interposed between the coin exterior case and the sealing plate, insulating the coin exterior case from the sealing plate, and a printed circuit board with conductive regions provided thereon, on which the coin type electric element is mounted. In the printed circuit board, a first terminal face, which is one of the bottom of the coin exterior case and the sealing plate as a pair of terminals, is fixed on one of the conductive regions without a lead interposed between the first terminal and the one of the conductive regions by reflow soldering. A second terminal face, which is the other of the bottom of the coin exterior case and the sealing plate as the pair of the terminals, is fixed on the other conductive region by a lead soldered by reflow soldering.

In the printed circuit board with a coin type electric element, the sealing plate as the first terminal face is fixed directly on the one of the conductive regions by the soldering, and the bottom of the coin exterior case second terminal face is fixed on the other conductive region by a lead soldered by the soldering. In addition, the bottom of the coin exterior case as the first terminal face is fixed directly on the one of the conductive regions by the soldering, the sealing plate as the second terminal face is fixed on the other conductive region by a lead soldered by the soldering.

The lead is bent toward a position between the coin type electric element and the printed circuit board, and the bent portion is fixed on the other conductive region by the soldering. This construction has an advantage that the area mounting the coin type electric element on the printed circuit board can be smaller. Further, an insulating film is provided on a position, which opposes to the bent portion. The insulating film can properly prevent electrical shorting between the bent portion of the lead and the first terminal face.

In the coin type electric element, the first terminal face, which is soldered on the conductive region of the printed circuit board, is plated with a metal having an affinity for solder. In addition, a metal film is fixed on the first terminal face, which is soldered on the one of the conductive regions, of the coin type electric element.

The temperature of a component, which is carried into a reflow soldering equipment, is proportional to the amount of heat absorbed, and is inversely proportional to its specific heat. The amount of heat absorbed increases according to an area. The specific heat is a constant specified with a material of a component. Therefore, a temperature of a component, whose surface area is large and whose specific heat is small, rises quickly. However, this is in the case without a change of state of a component. In the case that a state of a component changes from a solid state to a liquid state, the heat of fusion limits its temperature rise. The heat of fusion is large as compared with the specific heat, and limits a temperature rise remarkably. For example, in tin contained in solder, Its specific heat is 0.053 cal/g, while Its heat of fusion is 14 cal/g. In addition, in lead contained in solder, its specific heat and Its heat of fusion are 0.0309 cal/g, 5.5 cal/g respectively. The heat of fusion keeps the temperature of the solder heated at the melting point until the whole of solder is melted. After the whole of solder is melted, the temperature rises in proportion to the amount of heat absorbed. FIG. 10 is a graph showing the temperature rise of the solder against the amount of heat absorbed. As shown in FIG. 10, after solder, which changes from a solid to a liquid, is heated to melting point, the heat of fusion keeps the temperature of the solder heated at the melting point. After the whole of solder is melted into a liquid, its temperature rises gradually. Accordingly, solder temporarily limits its temperature rise around Its melting point. Solder, which limits its temperature rise, is in intimate contact with the first terminal face, and delays the temperature rise of the first terminal face. The first terminal face is a coin exterior case or a sealing plate. Thus, solder, which limits its temperature rise, delays the temperature rise of the exterior case or the sealing plate of the coin type electric element, and effectively prevents thermal influence. Especially, solder is in intimate contact with the first terminal face in a large area to fix the coin type electric element firmly on the printed circuit board. This improves the effect that solder limits the temperature rise of the first terminal face. Limiting the temperature rise of the first terminal face in a large area can prevent thermal influence in the coin type electric element. The exterior case or the sealing plate as the first terminal face is made of a metal with high thermal conductivity. Accordingly, limiting the temperature rise of the first terminal face in a large area limits the temperature rise of the coin type electric element, so that the maximum heated temperature of the insulating seal, etc. can be low. A coin type electric element is heated to the temperature close to its limit in order to prevent a cold Joint. Therefore, decreasing its temperature rise can extremely Improve reliability of a product, even the decreased temperature rise is not very much. The reason is that limiting under the maximum heated temperature can almost eliminate defectives caused of exceeding the maximum temperature of an insulating seal.

Furthermore, reflow soldering effectively limits the temperature rise of the first terminal face of the coin type electric element in a large area, but provides an environment in that solder is attached firmly by melting. Accordingly, reflow soldering effectively eliminates a cold Joint. The reason is that the temperature rises of the first terminal face, on which solder is attached by melting, the conductive regions, lead etc. are not limited by heat of fusion. That Is, although the temperature rises of solder and the first terminal face in contact with It are limited by heat of fusion, the temperature rise of a portion to be attached with melted solder is not limited. Therefore, reflow soldering provides an environment in that the temperature of the portion rises quickly. This provides ideal intimate contact of solder.

As mentioned above, as comparison between the state that the first terminal face of the coin type electric element fixed on the conductive region by reflow soldering and the state that a lead is soldered on a printed circuit board by soldering Iron, both of the heated solder are very different from each other. Solder on the tip of a soldering iron is already melted. Since melted solder and a soldering iron heat a lead and a conductive region, the temperature rises of a lead and a conductive region are not limited. In addition, a technology, in which leads of a coin type electric element connected to conductive regions of the printed circuit board without a soldering Iron by reflow soldering, has developed. In this technology, two leads connected to terminals of a coin type electric element are soldered by reflow soldering. That is, in the coin type electric element connected to the printed circuit board in this construction, both the first terminal face and the second terminal face are connected to leads, as shown in FIG. 1. The coin type electric element connected to the printed circuit board in this construction has a disadvantage that the coin type electric element receives thermal influence by heating during reflow soldering.

Further, a coin type electric element of the present invention have a coin exterior case formed of metal and in a coin shape with a bottom and an opening, a sealing plate, which is fixed on the opening of the coin exterior case, sealing the coin exterior case, and an insulating seal, which is interposed between the coin exterior case and the sealing plate, insulating the coin exterior case from the sealing plate. In the coin type electric element, one of the bottom of the coin exterior case and the sealing plate as a pair of terminals is a first terminal face. The other of the bottom of the coin exterior case and the sealing plate as the pair of the terminals is a second terminal face. A soldering face to be fixed by reflow soldering is provided on a tip portion of a lead, which is bent toward a surface side of the first terminal face and is connected to the second terminal face. The coin type electric element is a coin type battery or a capacitor. Furthermore, an insulating film is provided on a position, which opposes to the bent portion, in a surface of the bottom of the coin exterior case or a surface of the sealing plate.

A coin type battery and a printed circuit board with a coin type electric element of the present invention has an advantage that the coin type electric element can be mounted on a small mount area and can be fixed firmly and with stability on a printed circuit board by soldering, and can prevent from a thermal Influence. The reason is that the first soldering face to be fixed by reflow soldering is provided on the first terminal face, and a second soldering face to be fixed by reflow soldering is provided on the tip portion of the lead connected to the second terminal face, in the coin type electric element. Further, in the printed circuit board with a coin type electric element, the first terminal face, which is one of the bottom of the coin exterior case and the sealing plate as a pair of terminals, is fixed on one of the conductive regions by reflow soldering without a lead Interposed between the first terminal and the one of the conductive regions, and the second terminal face, which is the other of the bottom of the coin exterior case and the sealing plate as the pair of the terminals, is fixed on the other conductive region by a lead soldered by reflow soldering.

The construction, in which the first terminal face is directly fixed by reflow soldering, can reduce a mount area of the coin type electric element compared with a conventional construction, in which both terminals are fixed by leads. The reason is that the coin type electric element is fixed on the conductive regions by reflow soldering without outwardly projecting a soldering portion of a lead from the coin type electric element. As compared with a mount area defined as 100 of a printed circuit board with a conventional construction shown in FIG. 1 and FIG. 2, the mount area of printed circuit boards according to embodiments of the present invention shown in FIG. 3, FIG. 5 and FIG. 6 was 79, and the mount area of printed circuit boards according to embodiments of the present invention shown in FIG. 4, FIG. 7 and FIG. 8 was 70. These constructions can reduce mount areas remarkably.

Further, the construction, in which the first terminal face is fixed by reflow soldering without a lead, has an advantage that the coin type electric element is effectively prevented from a thermal influence caused by heating the whole of coin type electric element to high temperature. The reason is that the temperature rise of soldering is limited and the temperature rise of the first terminal face is delayed by the heat of fusion of solder melted from a solid to a liquid. The temperature rise of melted solder is temporarily limited around melting point by the heat of fusion. Thus, the temperature rise of the exterior case as the first terminal face or the sealing plate is limited by melted solder, so that the whole of coin type electric element can be effectively prevented from being heated to high temperature. Especially, it can more effectively prevent the temperature rise that solder is in intimate contact with the first terminal face in a large area and the coin type electric element is firmly fixed on the printed circuit board.

Furthermore, the coin type electric element of the present invention, in which the first soldering face and the second soldering face are positioned substantially in a same plane, has an advantage that fixing the first soldering face and the second soldering face together by reflow soldering bring a high effective mass production.

A printed circuit board with a coin type electric element of the present invention has the coin type electric element having a coin exterior case formed of metal and in a coin shape with a bottom and an opening, a sealing plate, which is fixed on the opening of the coin exterior case, sealing the coin exterior case, an insulating seal, which is interposed between the coin exterior case and the sealing plate, insulating the coin exterior case from the sealing plate, a printed circuit board with conductive regions provided thereon, on which the coin type electric element is mounted, and a lead connected to the second terminal face. In the printed circuit board, one of the bottom of the coin exterior case and the sealing plate as a pair of terminals is a first terminal face, the other of the bottom of the coin exterior case and the sealing plate as the pair of the terminals is a second terminal face. The second terminal face is fixed on a conductive region of the printed circuit by a lead with a soldering face to be soldered by reflow soldering at an tip portion of the lead, which is bent toward a surface side of the first terminal face.

The above and further objects and features of the invention will more fully be apparent from the following detailed description and accompanying drawings.

DETAILED DESCRIPTION OF THE PREFERRED EMBODIMENTS OF THE INVENTION

Figure 1:
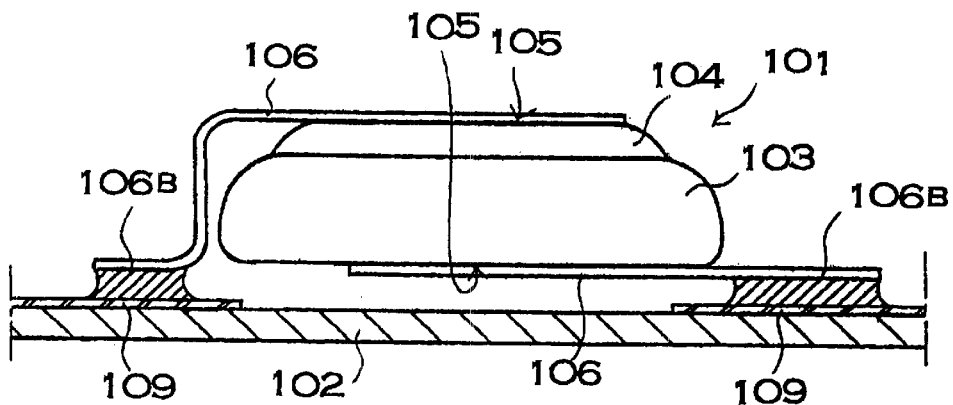
FIG. 1 is a sectional view of a conventional printed circuit board, on which a coin type electric element is mounted.
Figure 2:
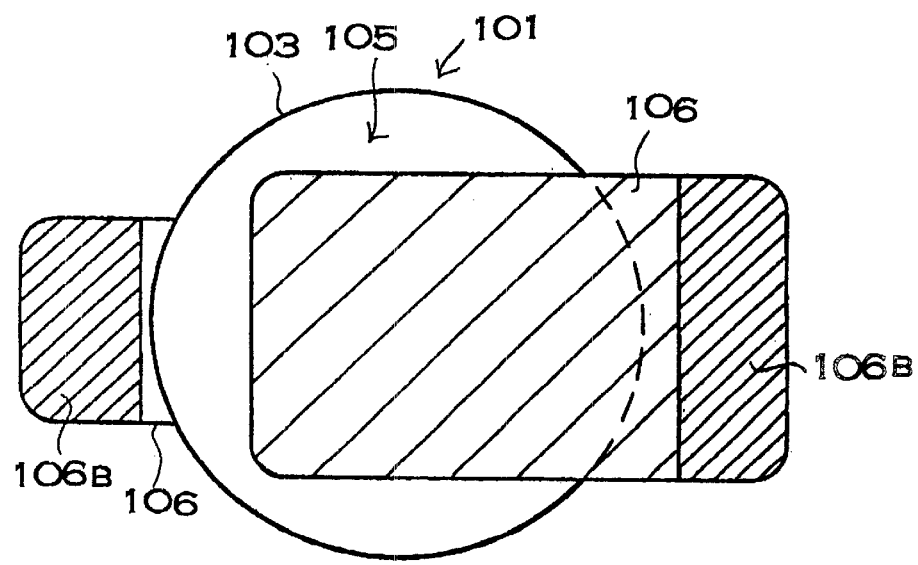
FIG. 2 is a bottom plan view showing a contact surface in contact with a printed circuit board of a coin type electric element shown in FIG. 1.
Figure 3:
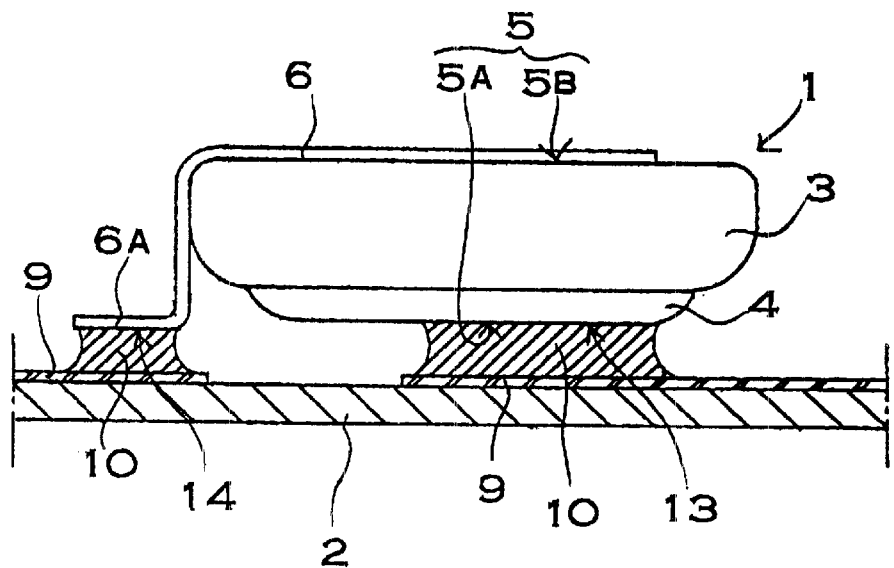
FIG. 3 is a sectional view of a printed circuit board, on which a coin type electric element is mounted, according to an embodiment of the present invention.
Figure 4:
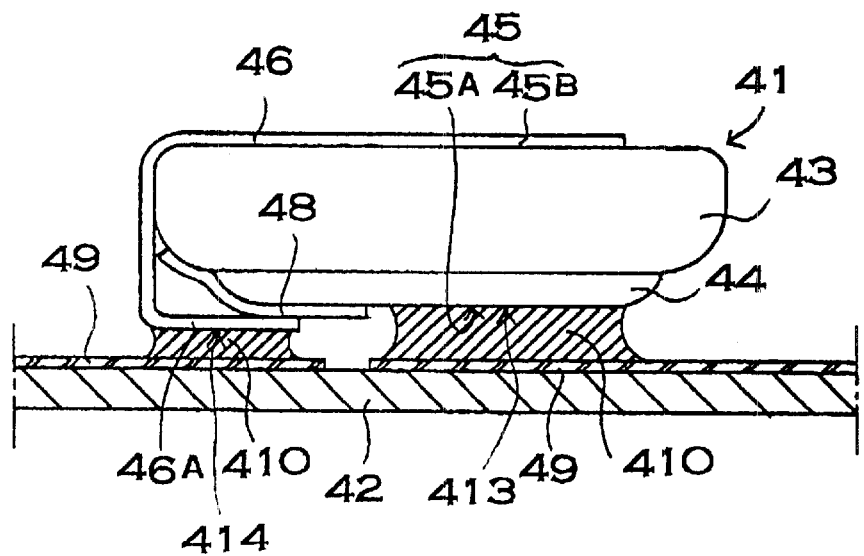
FIG. 4 is a sectional view of a printed circuit board, on which a coin type electric element is mounted, according to another embodiment of the present invention.
Figure 5:
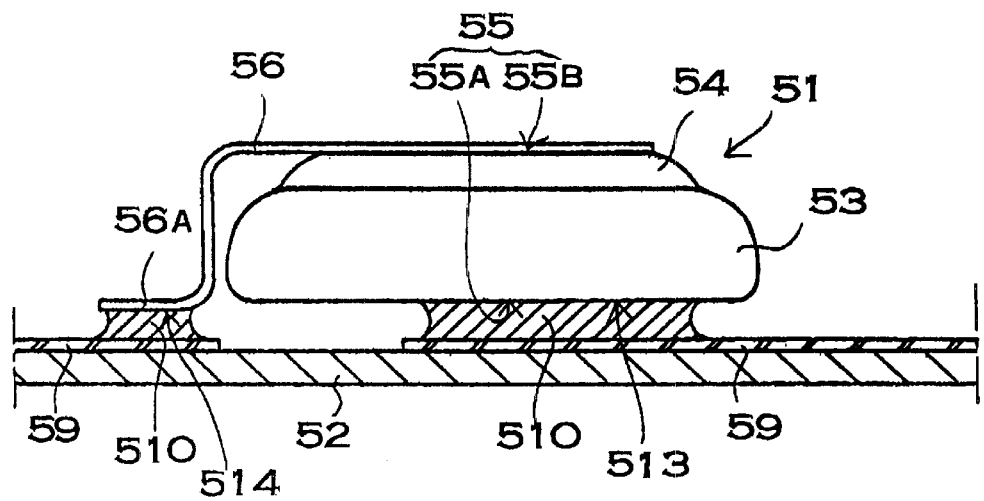
FIG. 5 is a sectional view of a printed circuit board, on which a coin type electric element is mounted, according to another embodiment of the present invention.
Figure 6:
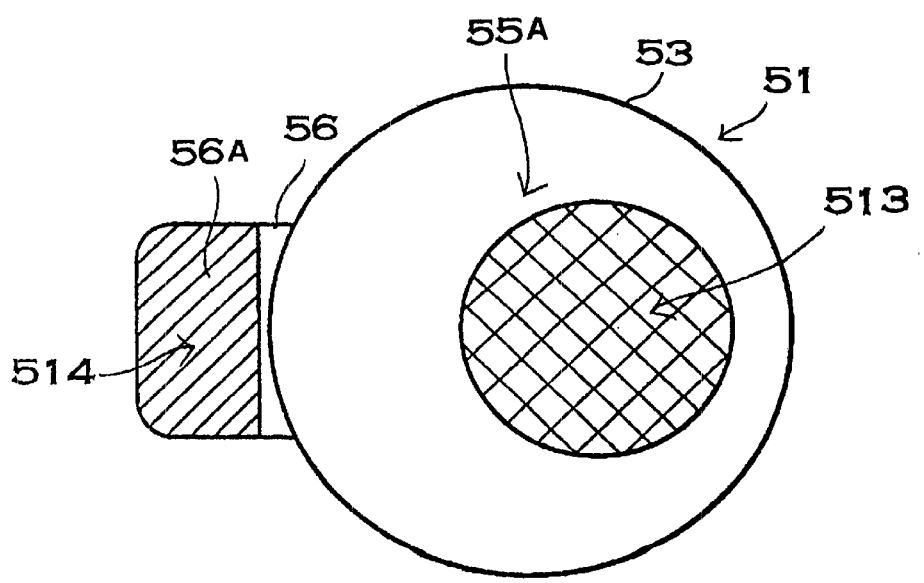
FIG. 6 is a bottom plan view showing a contact surface in contact with a printed circuit board of a coin type electric element shown in FIG. 5.

FIG. 3 to FIG. 5, and FIG. 7 show printed circuit boards 2, 42, 52, and 72, on which coin type electric elements 1, 41, 51, and 71 are mounted. The coin type electric elements 1, 41, 51, and 71 are electric elements, such as a coin type battery or a coin type capacitor, and are elements, which have exterior cases 3, 43, 53, and 73 and sealing plates 4, 44, 54, and 74 as a pair of terminals 5, 45, 55, and 75. In the coin type electric element 1, a sealing plate 4 seals an opening of the exterior case 3, as shown in the sectional view of FIG.

Figure 9:
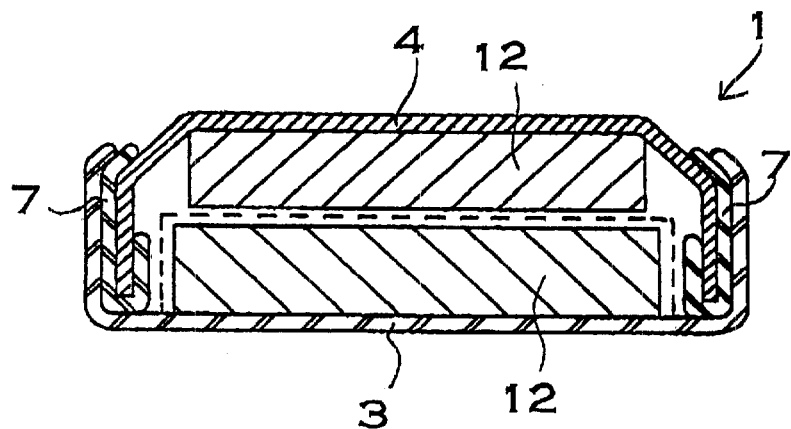
FIG. 9 is a sectional view of one example of a coin type electric element.
Figure 10:
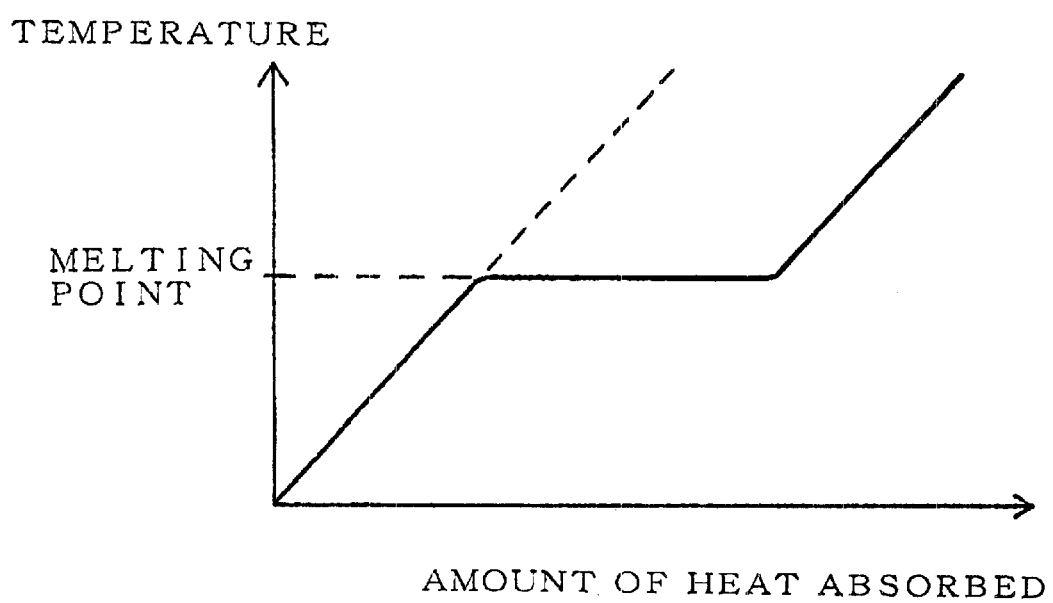
FIG. 10 is a graph showing the temperature rise of solder against the amount of heat absorbed.

9. An exterior case 3 is a coin type case with a bottom, which encloses bottom side of the case. The coin exterior case 3 of such a shape is formed by press forming a metal plate. A sealing plate 4 is also formed by press forming a metal plate. The sealing plate 4 of FIG. 9 has a cylindrical periphery. An insulating seal 7 is interposed and attached between the cylinder portion and the coin exterior case 3. The insulating seal 7 is in intimate contact with the sealing plate 4 and the coin exterior case 3, and seals the opening of the coin exterior case 3 airtightly by a sealing plate 4. A sealing plate 4 is fixed on the opening of the exterior case 3 by a caulking process, which bends the opening of the coin exterior case 3 inwardly. The insulating seal 7 seals the interior of the exterior case 3 airtightly, and insulates the sealing plate 4 from the coin exterior case 3. The coin exterior case 3 and sealing plate 4 insulated from each other are composed of a pair of terminals 5. The coin type battery contains positive and negative of electrode boards 12 in the exterior case 3. One of the positive and negative of electrode boards 12 is connected to the coin exterior case 3, and the other of them is connected to the sealing plate 4. The coin type capacitor has a pair of electrode plates, which opposes to each other, in the exterior case. One of the electrode plates is connected to the coin exterior case, and another is connected to the sealing plate. In the coin type electric element 1 of FIG. 9, the sealing plate 4 projects from the opening of the coin exterior case 3.

The coin type electric element 1 (41, 51 or 71) is fixed by soldering a pair of terminals 5 (45, 55 or 75) on the printed circuit board 2 (42, 52 or 72) in use of reflow soldering. One of the bottom of the coin exterior case 3 (43, 53 or 73) and the sealing plate 4 (44, 54, or 74) as the pair of terminals 5 (45, 55 or 75) is a first terminal face 5A (45A, 55A or 75A), the other of the bottom of the coin exterior case 3 (43, 53 or 73) and the sealing plate 4 (44, 54 or 74) 18 a second terminal face 5B (45B, 55B or 75B). The pair of terminals 5 (45, 55 or 75) are provided on respective both surfaces of the coin type electric element 1 (41, 51 or 71). One of the pair of terminals 5 (45, 55 or 75) is the bottom of the first terminal face 5A (45A, 55A or 75A), the other is the second terminal face 5B (45B, 55B or 75B). In the coin type electric element 1 (41, 51 or 71), a first soldering face 13 (413, 513 or 713) is provided on the first terminal face 5A (45A, 55A or 75A). The first soldering face 13 (413, 513 or 713) is fixed on one of conductive regions 9 (49, 59 or 79) of the printed circuit board 2 (42, 52 or 72) by reflow soldering . Further, in the coin type electric element 1 (41, 51 or 71), a lead 6 (46, 56 or 76) is connected to the second terminal face 5B (45B, 55B or 75B). A second soldering face 14 (414, 514 or 714) is provided on the tip portion of the lead 6 (46, 56 or 76). The second soldering face 14 (414, 514 or 714) is fixed on the other conductive region 9 (49, 59 or 79) of the printed circuit board 2 (42, 52 or 72) by reflow soldering. The first soldering face 13 (413, 513 or 713) and the second soldering face 14 (414, 514 or 714) are positioned substantially in a same plane to be capable of reflow soldering together. In the coin type electric elements 1 and 41 of FIG. 3 and FIG. 4, the sealing plates 4 and 44 are the first terminal faces 5A and 45A, and the bottoms of exterior cases 3 and 43 are the second terminal faces 5B and 45B. In the coin type electric elements 51 and 71 of FIG. 5 and FIG. 7, the bottoms of exterior cases 53 and 73 are the first terminal faces 55A and 75A, and the sealing plates 54 and 74 are the second terminal faces 55B and 75B.

Figure 7:
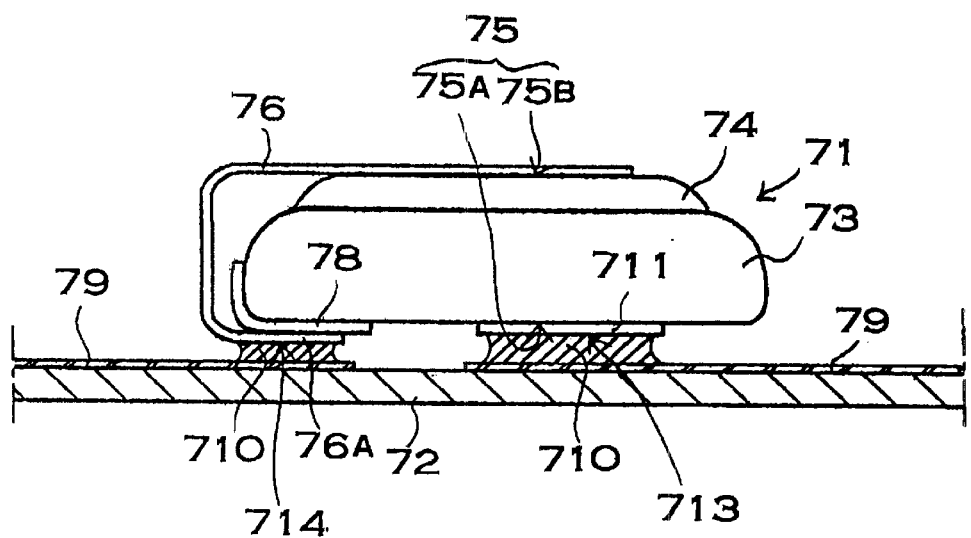
FIG. 7 is a sectional view of a printed circuit board, on which a coin type electric element is mounted, according to another embodiment of the present invention.
Figure 8:
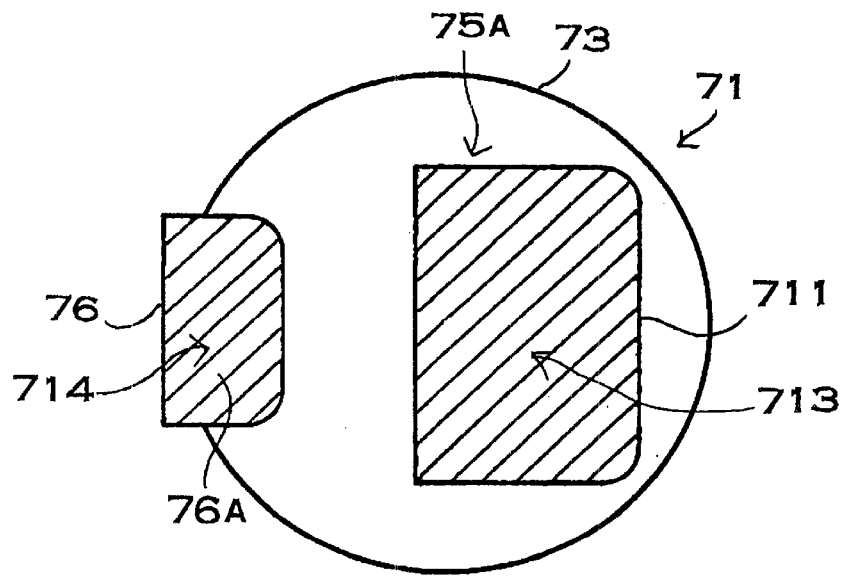
FIG. 8 is a bottom plan view showing a contact surface in contact with a printed circuit board of a coin type electric element shown in FIG. 7.

The coin exterior case 3 (43, 53, and 73) or the sealing plates 4 (44, 54, and 74) as the first terminal face 5A (45A, 55A, and 75A) are fixed on the one of conductive regions 9 (49, 59 or 79) of the printed circuit board 2 (42, 52 or 72) by reflow soldering. The first terminal face 5A (45A, 55A, and 75A) can be plated on its surface, or the first soldering face 713 can be provided by welding a metal film 711 thereon as shown in FIG. 7 and FIG. 8, so as to be fixed more firmly by reflow soldering. When the surface of the first terminal face 5A (45A, 55A, and 75A) is plated, a metal having a high affinity for solder 10 (410, 510 or 710). It is preferable that tinning is used for plating the surface of the first terminal face 5A (45A, 55A or 75A). The reason is that solder 10 (410, 510 or 710) contains tin. The first terminal face 5A (45A, 55A, and 75A) plated with tin is fixed more firmly, because of suitability with solder 10 (410, 510 or 710). However, It is not specifically limited to tinning. Nickel plating, copper coating, brass plating, zinc galvanizing, etc. can firmly fix by reflow soldering. A metal having an affinity for reflow solder, such as nickel, is used as the metal film 711. A clad material, which composed of different laminated metal layers, is also used as the metal film 711. The clad material have the first soldering face, which is in contact with reflow solder, of metal having an affinity for solder.

When the first terminal face 5A (45A, 55A or 75A) of the coin type electric element 1 (41, 51 or 71) is plated or the metal film 711 is provided thereon, the coin exterior case 3 (43, 53 or 73) or the sealing plates 4 (44, 54 or 74) can be formed of a stainless steel. A stainless steel does not have an affinity for reflow solder. However, interposing the plated portion or the metal film 711 can fix the the coin exterior case 3 (43, 53 or 73) or the sealing plates 4 (44, 54 or 74) on the printed circuit board 2 (42, 52 or 72) by reflow soldering, even though it is formed of a stainless steel.

The second terminal face 5B (45B, 55B or 75B) is connected to the lead 6 (46, 56 or 76) by spot welding or laser welding. The lead 6 (46, 56 or 76) is bent along the periphery of the coin type electric element 1 (41, 51 or 71), and Its tip portion is bent toward the inside or outside of the coin type electric element 1 (41, 51 or 71). In the lead 46 (76) of FIG. 4 (FIG. 7), Its tip portion is bent toward a surface side of the first terminal face 45A (75A), which is the inside of the coin type electric element 41 (71), that is, toward a position between the coin type electric element 41 (71) and the printed circuit board 42 (72). Such a construction has an advantage that the mount area of the coin type electric element 41 (71) can be minimized. In the coin type electric element 41 (71) with the construction, an insulating film 18 (78) is provided on a position, which opposes to the bent portion 46A (76A) of the lead 46 (76), on the bottom of the coin exterior case 43 (73) or the surface of the sealing plate 48 (78), in order to prevent electric shorting of the lead 46 (76). The insulating film 48 (78) is a resist or a insulating sheet, which are heat-resistant to reflow soldering. For example, thermosetting resin, such as an epoxy resin, is used for the heat-resistant resist. After bending process, the lead 46 (76) can be connected to the second electrode 45B (75B) of the coin type electric element 41 (71). In addition, after connected to the second electrode 45B (75B), the lead 46 (76) can be aslo bent, The insulating film 48 (78) is attached on the coin type electric element 41 (71), before the process in which the lead 46 (76) is connected.

The bent portion 6A (46A, 56A or 76A) of the lead 6 (46, 66 or 76) is fixed on the conductive region 9 (49, 59 or 79) of the printed circuit board 2 (42, 52 or 72) by reflow soldering. The lead 6 (56) of FIG, 3 (FIG. 5) is fixed to the printed circuit board 2 (52) at the outside of the coin type electric element 1 (51). In such a construction, the lead 6 (56) is fixed at a distance from the first terminal 5A (55A)

to the printed circuit board 2 (52). Accordingly, the construction has an advantage that electric shorting between the lead 5 (56) and the first terminal 5A (55A) can be effectively prevented.

Conductive regions 9 (49, 59 or 79), which are a region to be connected to the first terminal face 5A (45A, 55A or 75A) and a region to be connected to the tip portion of the lead 6 (46, 56 or 76) at a distance from each other, are fixed on the printed circuit board 2 (42, 52 or 72). The coin type electric element 1 (41, 51 or 71) is connected to the conductive regions 9 (49, 59 or 79) of the printed circuit board 2 (42, 52 or 72) as follows:

(1) The first terminal face 5A (45A, 55A or 75A) of the coin type electric element 1 (41, 51 or 71) is temporarily attached on the printed circuit board 2 (42, 52 or 72) by the cream solder 10 (410, 510 or 710). At that time, the tip portion of the lead 6 (46, 56 or 76) is also temporarily attached on the printed circuit board 2 (42, 52 or 72) by the cream solder 10 (410, 510 or 710). When the coin type electric element 1 (41, 51 or 71) is thrust toward the printed circuit board 2 (42, 52 or 72), the cream solder 10 (410, 510 or 710) spreads in the gap between the first terminal face 5A (45A, 55A or 75A) and the conductive region 9 (49, 59 or 79), and is in intimate contact with the first terminal face 5A (45A, 56A or 75A).

(2) The printed circuit board 2 (42, 52 or 72) is carried into a reflow soldering equipment. In the reflow soldering equipment, the printed circuit board 2 (42, 52 or 72), the coin type electric element 1 (41, 51 or 71), and lead 6 (46, 56 or 76) are heated, then the cream solder 10 (410, 510 or 710) is melted by heat. At that time, since a metal contained in the cream solder 10 (410, 510 or 710) is melted from a solid to a liquid, the temperature rise is limited by the heat of fusion. The heat of fusion is much larger than the specific heat. The temperature of solder 10 (410, 510 or 710) is kept at the melting point by the heat of fusion until the whole solder is melted. Accordingly, until the whole solder 10 (410, 510 or 710) is melted, Its temperature rise is little, so that the rise delays The solder 10 (410, 510 or 710), which limits its temperature rise, is in intimate contact with the first terminal face 5A (45A, 55A or 75A), and limits the temperature rise of the coin type electric elements 1 (41, 51 or 71). While the heat of fusion of solder 10 (410, 510 or 710) limits the temperature rise of the first terminal face 5A (45A, 55A or 75A), reflow soldering heats the first terminal face 5A (45A, 55A or 75A), and the temperature rises. Under such a condition, when the temperature of the first terminal face 5A (45A, 55A or 75A) becomes higher than the melting point of the solder 10 (410, 510 or 710), the solder 10 (410, 510 or 710) flows smoothly. Then the melted solder 10 (410, 510 or 710) is in intimate contact with the first terminal face 5A (45A, 55A or 75A). The temperature of the conductive region 9 (49, 59 or 79), on which the first terminal face 5A (45A, 55A or 75A) is soldered, also rises, the solder 10 (410, 510 or 710) is in intimate contact with it. As mentioned above, the first terminal face 5A (45A, 55A or 75A) is soldered on the conductive region 9 (49, 59 or 79) of the printed circuit board 2 (42, 52 or 72). At that time, the lead 6 (46, 56 or 76) connected to the second terminal face 5B (45B, 55B or 75B) is also soldered on the conductive region 9 (49, 59 or 79) of the printed circuit board 2 (42, 52 or 72). The temperature of the lead 6 (46, 56 or 76) rises more quickly than the first terminal face 5A (45A, 55A or 75A). Therefore, when the first terminal face 5A (45A, 55A or 75A) is soldered, the lead 6 (46, 56 or 76) is firmly soldered on the conductive region 9 (49, 59 or 79).

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds thereof are therefore intended to be embraced by the claims.

What is claimed is:

1. A coin type electric element comprising:
    a coin exterior case formed of metal and in a coin shape with a bottom and an opening;
    a sealing plate, which is fixed on the opening of the coin exterior case, sealing the coin exterior case; and
    an insulating seal, which is interposed between the coin exterior case and the sealing plate, insulating the coin exterior case from the sealing plate, wherein
        one of the bottom of the coin exterior case and the sealing plate as a pair of terminals is a first terminal face,
        the other of the bottom of the coin exterior case and the sealing plate as the pair of the terminals is a second terminal face,
        a first soldering face to be fixed by reflow soldering is provided on the first terminal face,
        a second soldering face to be fixed by reflow soldering is provided on a tip portion of a lead connected to the second terminal face, and
        the first soldering face and the second soldering face are positioned substantially in a same plane.

2. The coin type electric element according to claim 1, wherein the coin type electric element is a coin type battery.

3. The coin type electric element according to claim 1, wherein the coin type electric element is a capacitor.

4. The coin type electric element according to claim 1, wherein,
    the tip portion of the lead is bent toward a surface side of the first terminal face, and
    an insulating film is provided on a position, which opposes to the bent portion, in a surface of the bottom of the coin exterior case or a surface of the sealing plate.

5. The coin type electric element according to claim 1, wherein,
    the first soldering face is provided on the first terminal face by plating with a metal having an affinity for solder.

6. The coin type electric element according to claim 1, wherein the first soldering face is provided by fixing a metal film on the first terminal face.

7. A printed circuit board with a coin type electric element comprising:
    the coin type electric element having
        a coin exterior case formed of metal and in a coin shape with a bottom and an opening,
        a sealing plate, which is fixed on the opening of the coin exterior case, sealing the coin exterior case, and
        an insulating seal, which is interposed between the coin exterior case and the sealing plate, insulating the coin exterior case from the sealing plate, and
    a printed circuit board with conductive regions provided thereon, on which the coin type electric element is mounted,
    wherein,
        a first terminal face, which is one of the bottom of the coin exterior case and the sealing plate as a pair of terminals, is fixed on one of the conductive regions by reflow soldering without a lead interposed between the first terminal face and the one of the conductive regions, and a second terminal face, which is the other of the bottom of the coin exterior case and the sealing plate as the pair of the terminals, is fixed on the other conductive region by a lead soldered by reflow soldering.

8. The printed circuit board with a coin type electric element according to claim 7, wherein the coin type electric element is a coin type battery.

9. The printed circuit board with a coin type electric element according to claim 7, wherein the coin type electric element is a capacitor.

10. The printed circuit board with a coin type electric element according to claim 7, wherein, the sealing plate as the first terminal face is directly fixed on the one of the conductive regions by the soldering, and the bottom of the coin exterior case second terminal face is fixed on the other conductive region by a lead soldered by the soldering.

11. The printed circuit board with a coin type electric element according to claim 7, wherein, the bottom of the coin exterior case as the first terminal face is directly fixed on the one of the conductive regions by the soldering, the sealing plate as the second terminal face is fixed on the other conductive region by a lead soldered by the soldering.

12. The printed circuit board with a coin type electric element according to claim 7, wherein, the lead is bent toward a position between the coin type electric element and the printed circuit board, and the bent portion is fixed on the other conductive region by the soldering.

13. The printed circuit board with a coin type electric element according to claim 7, wherein an insulating film is provided on a position, which opposes to the bent portion.

14. The printed circuit board with a coin type electric element according to claim 7, wherein the first terminal face is plated with a metal having an affinity for solder.

15. The printed circuit board with a coin type electric element according to claim 7, wherein a metal film is fixed on the first terminal face, which is soldered on the one of the conductive regions, of the coin type electric element.

16. A coin type electric element comprising:

a coin exterior case formed of metal and in a coin shape with a bottom and an opening, a sealing plate, which is fixed on the opening of the coin exterior case, sealing the coin exterior case, and an insulating seal, which is interposed between the coin exterior case and the sealing plate, insulating the coin exterior case from the sealing plate, wherein, one of the bottom of the coin exterior case and the sealing plate as a pair of terminals is a first terminal face, the other of the bottom of the coin exterior case and the sealing plate as the pair of the terminals is a second terminal face, and a soldering face to be fixed by reflow soldering is provided on a tip portion of a lead, which is bent toward a surface side of the first terminal face and is connected to the second terminal face.

17. The coin type electric element according to claim 16, wherein the coin type electric element is a coin type battery.

18. The coin type electric element according to claim 16, wherein the coin type electric element is a capacitor.

19. The coin type electric element according to claim 16, wherein an insulating film is provided on a position, which opposes to the bent portion, in a surface of the bottom of the coin exterior case or a surface of the sealing plate.

20. A printed circuit board with a coin type electric element comprising:

the coin type electric element having a coin exterior case formed of metal and in a coin shape with a bottom and an opening, a sealing plate, which is fixed on the opening of the coin exterior case, sealing the coin exterior case, an insulating seal, which is interposed between the coin exterior case and the sealing plate, insulating the coin exterior case from the sealing plate, a printed circuit board with conductive regions provided thereon, on which the coin type electric element is mounted, and a lead connected to the second terminal face, wherein, one of the bottom of the coin exterior case and the sealing plate as a pair of terminals is a first terminal face, the other of the bottom of the coin exterior case and the sealing plate as the pair of the terminals is a second terminal face, and the second terminal face is fixed on a conductive region of the printed circuit board by a lead with a soldering face to be soldered by reflow soldering at a tip portion of the lead, which is bent toward a surface side of the first terminal face.

21. The printed circuit board with a coin type electric element according to claim 20, wherein the coin type electric element is a coin type battery.

22. The printed circuit board with a coin type electric element according to claim 20, wherein the coin type electric element is a capacitor.

23. The printed circuit board with a coin type electric element according to claim 20, wherein an insulating film is provided on a position, which opposes to the bent portion.

* * * * *